US011551735B2

(12) United States Patent
Ware et al.

(10) Patent No.: US 11,551,735 B2
(45) Date of Patent: Jan. 10, 2023

(54) HIGH PERFORMANCE, NON-VOLATILE MEMORY MODULE

(71) Applicant: Rambus Inc., Sunnyvale, CA (US)

(72) Inventors: Frederick A. Ware, Los Altos Hills, CA (US); Ely Tsern, Los Altos, CA (US); John Eric Linstadt, Palo Alto, CA (US)

(73) Assignee: Rambus, Inc., San Jose, CA (US)

( * ) Notice: Subject to any disclaimer, the term of this patent is extended or adjusted under 35 U.S.C. 154(b) by 190 days.

(21) Appl. No.: 15/555,470

(22) PCT Filed: Mar. 11, 2016

(86) PCT No.: PCT/US2016/022046
§ 371 (c)(1),
(2) Date: Sep. 1, 2017

(87) PCT Pub. No.: WO2016/145328
PCT Pub. Date: Sep. 15, 2016

(65) Prior Publication Data
US 2019/0115059 A1  Apr. 18, 2019

Related U.S. Application Data

(60) Provisional application No. 62/221,969, filed on Sep. 22, 2015, provisional application No. 62/197,991,
(Continued)

(51) Int. Cl.
G11C 11/00 (2006.01)
G11C 5/04 (2006.01)
(Continued)

(52) U.S. Cl.
CPC .......... G11C 11/005 (2013.01); G06F 3/0619 (2013.01); G06F 3/0659 (2013.01);
(Continued)

(58) Field of Classification Search
CPC .... G06F 3/0619; G06F 3/0659; G06F 3/0673; G06F 11/1004; G06F 11/1076;
(Continued)

(56) References Cited

U.S. PATENT DOCUMENTS 4,546,475 A    10/1985  Sharpless et al.
5,856,987 A *  1/1999  Holman .............. H03M 13/151
                                                   714/752
(Continued)

FOREIGN PATENT DOCUMENTS

CN    101573760 A    11/2009
CN    102473078 A    5/2012
(Continued)

OTHER PUBLICATIONS

K. Khalifa, H. Fawzy, S. El-Ashry and K. Salah, "Memory controller architectures: A comparative study," 2013 8th IEEE Design and Test Symposium, 2013, pp. 1-6, doi: 10.1109/IDT.2013. 6727083. (Year: 2013).*
(Continued)

Primary Examiner — Kalpit Parikh
(74) Attorney, Agent, or Firm — Lance Kreisman; Peninsula Patent Group

(57) ABSTRACT

Memory controllers, devices, modules, systems and associated methods are disclosed. In one embodiment, a memory module includes a pin interface for coupling to a memory controller via a bus. The module includes at least two non-volatile memory devices, and a buffer disposed between the pin interface and the at least two non-volatile memory devices. The buffer receives non-volatile memory access commands from the memory controller that are interleaved with DRAM memory module access commands.

20 Claims, 14 Drawing Sheets

Related U.S. Application Data filed on Jul. 28, 2015, provisional application No. 62/131,763, filed on Mar. 11, 2015.

(51) Int. Cl.

| | |
|---|---|
| *G11C 5/06* | (2006.01) |
| *G06F 3/06* | (2006.01) |
| *G06F 11/10* | (2006.01) |
| *G11C 7/10* | (2006.01) |
| *G11C 7/12* | (2006.01) |

(52) U.S. Cl.
CPC ........ *G06F 3/0673* (2013.01); *G06F 11/1004* (2013.01); *G06F 11/1076* (2013.01); *G11C 5/04* (2013.01); *G11C 5/063* (2013.01); *G11C 7/1057* (2013.01); *G11C 7/1078* (2013.01); *G11C 7/12* (2013.01)

(58) Field of Classification Search
CPC ....... G11C 7/1057; G11C 7/1078; G11C 7/12; G11C 5/04; G11C 5/063; G11C 11/005
See application file for complete search history.

(56) References Cited

U.S. PATENT DOCUMENTS

| | | | |
|---|---|---|---|
| 6,636,935 | B1 | 10/2003 | Ware et al. |
| 6,742,098 | B1 | 5/2004 | Halbert et al. |
| 6,769,050 | B1 | 7/2004 | Ware et al. |
| 6,785,782 | B1 | 8/2004 | Ware et al. |
| 6,889,304 | B2 | 5/2005 | Perego et al. |
| 6,926,657 | B1 | 8/2005 | Reed et al. |
| 7,577,789 | B2 | 8/2009 | Perego et al. |
| 8,069,379 | B2 | 11/2011 | Perego et al. |
| 8,139,390 | B2 | 3/2012 | Oh |
| 2006/0253642 | A1* | 11/2006 | Rybak ................... G06F 12/023 711/100 |
| 2008/0022186 | A1 | 1/2008 | Co et al. |
| 2008/0046666 | A1* | 2/2008 | Termaine ................ G06F 12/10 711/154 |
| 2008/0140916 | A1* | 6/2008 | Oh ......................... G11C 16/08 711/103 |
| 2008/0192649 | A1* | 8/2008 | Pyeon ................... G11C 7/1063 370/254 |
| 2009/0006760 | A1* | 1/2009 | Bartley ............... G06F 12/0844 711/131 |
| 2009/0063785 | A1 | 3/2009 | Gower et al. |
| 2009/0168525 | A1* | 7/2009 | Olbrich ................. G06F 3/0604 365/185.11 |
| 2009/0172260 | A1* | 7/2009 | Olbrich ............... G06F 13/1657 711/103 |
| 2010/0091536 | A1* | 4/2010 | Kim ......................... G11C 7/00 365/51 |
| 2010/0110748 | A1* | 5/2010 | Best .................... G06F 12/0638 365/51 |
| 2010/0115191 | A1* | 5/2010 | Hampel ................ G06F 3/0614 711/103 |
| 2011/0219197 | A1* | 9/2011 | Perego ................ G06F 13/1678 711/154 |
| 2012/0079174 | A1 | 3/2012 | Nellans et al. |
| 2012/0155160 | A1 | 6/2012 | Alam et al. |
| 2013/0254495 | A1 | 9/2013 | Kim et al. |
| 2014/0101382 | A1 | 4/2014 | Kavlani et al. |
| 2014/0237152 | A1 | 8/2014 | Amirkhany et al. |
| 2017/0109096 | A1* | 4/2017 | Jean ......................... G06F 9/00 |

FOREIGN PATENT DOCUMENTS

| | | |
|---|---|---|
| CN | 103354939 A | 10/2013 |
| CN | 103558993 A | 2/2014 |
| CN | 104239225 A | 12/2014 |

OTHER PUBLICATIONS

EP Communication Pursuant to Rule 164(1) EPC With dated Sep. 26, 2018 re: EP Appln. No. 16762610.0. 13 Pages.

EP Response Filed on May 7, 2019 in Response to the Extended European Search Report Dated Jan. 22, 2019 and the Communication Pursuant to R. 70(2) and 70a(2) EPC Dated Feb. 8, 2019 re: EP Appln. No. 16762610.0. 20 Pages.

CN Office Action with dated Jul. 29, 2020 re: CN Appln. No. 201680010277.X. 24 pages. (With Translation).

EP Communication Pursuant to Article 94(3) EPC with dated Jan. 2, 2020 re: EP Appln. No. 16762610.0. 8 Pages.

EP Response as Filed Apr. 17, 2020 in Response to the Official Communication Pursuant to Art. 94(3) EPC dated Jan. 2, 2020 re: EP Appln. No. 16762610.0. 11 Pages.

CN Office Action dated May 14, 2021 re: CN Appln. No. 201680010277.X. 18 pages, (w/translation).

"Draft Standard for a High-Speed Memory Interface (SyncLink)," Draft 0.99 IEEE P1596.7-199X, pp. 1-56 (1996), Microprocessor and Microcomputer Standards Subcommittee of the IEEE Computer Society. 66 pages.

"IEEE Standard for High-Bandwidth Memory Interface Based on Scalable Coherent Interface (SCI) Signaling Technology (RamLink)", IEEE Std , p. 1596.4-1996, Sep. 15, 1996. 100 pages.

Diamond, Stephen L., "SyncLink: high-speed DRAM for the future", Micro, IEEE, vol. 16, No. 6, pp. 74-75, Dec. 1996. 2 pages.

Gjessing, S. et al., "A RAM link for high speed", IEEE Spectrum, Oct. 1992, pp. 52-53.

IEEE Standard for Scalable Coherent Interface (SCI), "Microprocessor and Microcomputer Standards Subcommittee of the IEEE Computer Society," IEEE Std. 1596-1992, Aug. 2, 1993. 271 pages.

Notification of the International Search Report and Written Opinion of the International Searching Authority with date of Aug. 8, 2016 re Int'l Appln. No. PCT/US2016/022046. 13 Pages.

Wiggers, H., "SyncLink A Proposal for an Implementation of IEEE P1596.4", Hewlett Packard, pp. 1-20 (Mar. 1995).

* cited by examiner

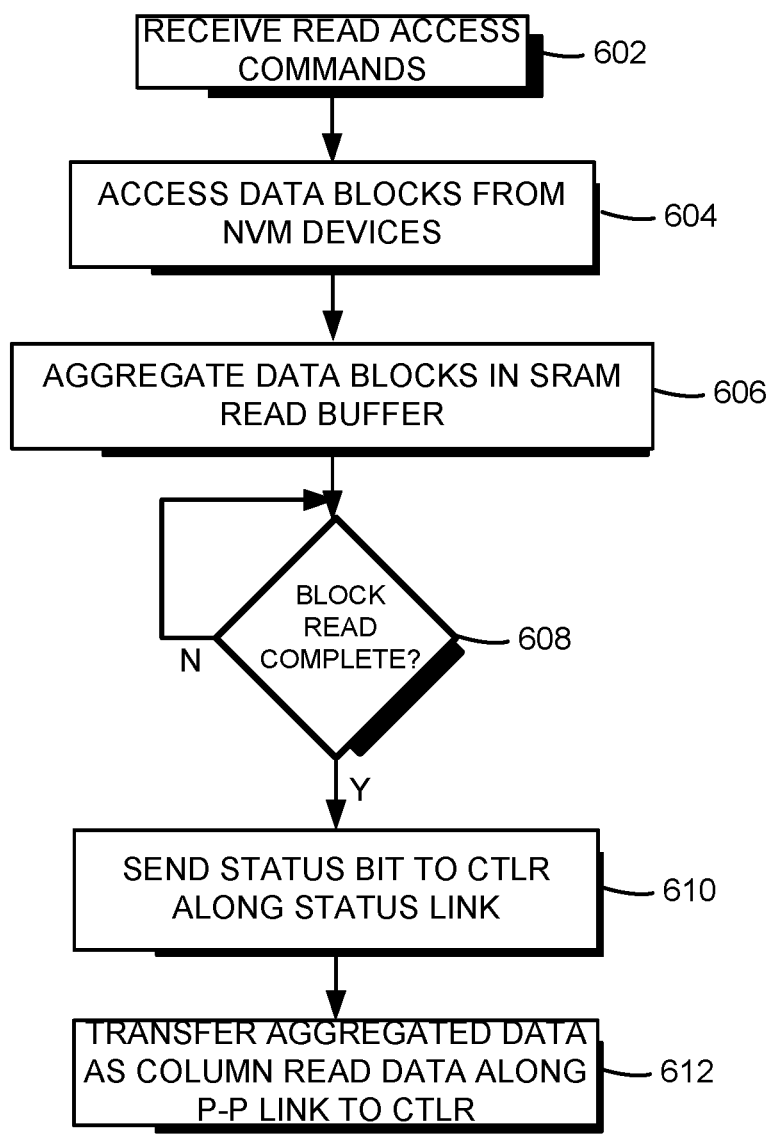

HIGH PERFORMANCE, NON-VOLATILE MEMORY MODULE

CROSS REFERENCES TO RELATED APPLICATIONS

This application is a national stage application of international application number PCT/US2016/22046, filed Mar. 11, 2016, which claims the benefit of U.S. Provisional Application No. 62/197,991, filed Jul. 28, 2015, Provisional Application No. 62/221,969, filed Sep. 22, 2015, and Provisional Application No. 62/131,763, filed Mar. 11, 2015, all of which are incorporated by reference herein in their entirety.

TECHNICAL FIELD

The disclosure herein relates to memory modules, memory controllers, memory devices, and associated methods.

BACKGROUND

Successive generations of dynamic random access memory components (DRAM) have appeared in the marketplace with steadily shrinking lithographic feature size. As a result, the device storage capacity from each generation has increased. Further, each generation's interface signaling rate has also increased, due to improved transistor performance.

Unfortunately, one metric of memory system design that has not shown comparable improvement is the module capacity of a standard memory channel. This capacity has steadily eroded as signaling rates increase. Part of the reason for this is the link topology used in standard memory systems. When more modules are added to the system, signal integrity degrades, and the signaling rate must be reduced. Typical memory systems today are limited to just one or two modules when operating at the maximum signaling rate.

Unless improvements are made, future memory systems may be limited to a single rank of devices (or a single rank of device stacks) on a single module at the highest signaling rates.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 6A illustrates one embodiment of a flow chart showing a read data transfer from the nonvolatile memory module from the perspective of the nonvolatile memory module.

DETAILED DESCRIPTION

Memory modules, memory controllers, devices and associated methods are disclosed. In one embodiment, a memory module is disclosed that includes a pin interface for coupling to a bus. The bus couples the module to a memory controller. The module includes at least two nonvolatile memory devices and a buffer disposed between the pin interface and the at least two non-volatile memory devices. The buffer receives nonvolatile memory access commands from the memory controller that are interleaved with DRAM memory module access commands. This allows for a point-to-point system architecture that can employ non-volatile memory modules and DRAM memory modules together to maximize both capacity and performance.

Figure 1:
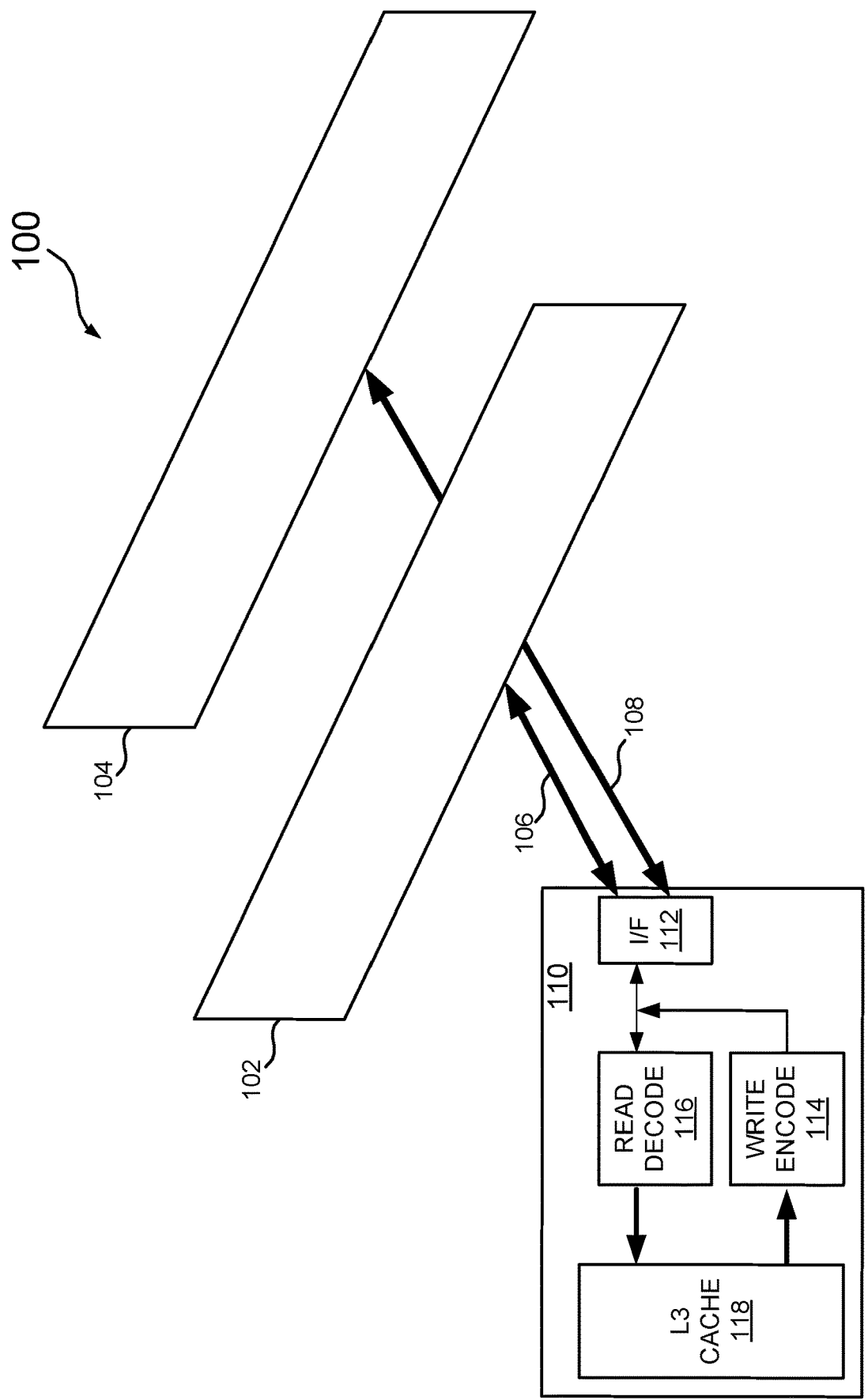
FIG. 1 illustrates one embodiment of a memory system that employs a memory controller, a nonvolatile memory module and a DRAM memory module.

Referring to FIG. 1, one embodiment of a memory system, generally designated 100, employs multiple memory modules 102 and 104 coupled to memory control circuitry 110 via point-to-point signaling links 106 and 108. The modules 102 and 104 may be of the same or different type, such as DRAM memory modules or non-volatile memory modules. The architecture described herein renders it possible to mix the different module types in a point-to-point topology to maximize memory capacity and performance.

With continued reference to FIG. 1, one specific embodiment of the memory control circuitry 110 may include, e.g., a discrete memory controller separate from a requestor integrated circuit (IC), or any IC that controls memory devices, such as DRAM and nonvolatile memory devices, and could be any type of system-on-chip (SoC). One embodiment of the memory control circuitry 110 employs an interface 112 to transmit and receive signals to and from the memory modules 102 and 104. Write data signals that are transmitted by the interface may be protected via error detection correction (EDC) bits that are encoded by a write error detection correction (EDC) encoder 114. The write EDC encoder 114 generates error information, such as EDC parity bits, associated with write data symbols. The error encoding may be generated in accordance with one of many acceptable EDC algorithms including, for example, straightforward single-bit Hamming codes, to more sophisticated high-speed BCH (Bose, Ray-Chaudhuri and Hocquenghem) codes. One specific error code suitable for the embodiments described herein is a 64/72 error detection correction code. Other EDC codes, such as Reed-Solomon codes, turbo codes, cyclic redundancy codes (CRC) and low density parity check (LDPC) codes may also be acceptable. The memory control circuitry 110 includes a read EDC decoder 116 to decode error information associated with incoming read data symbols from the memory modules 102 and 104. A level 3 cache 118 interfaces the memory control circuitry to a host processing resource (not shown).

Figure 2:
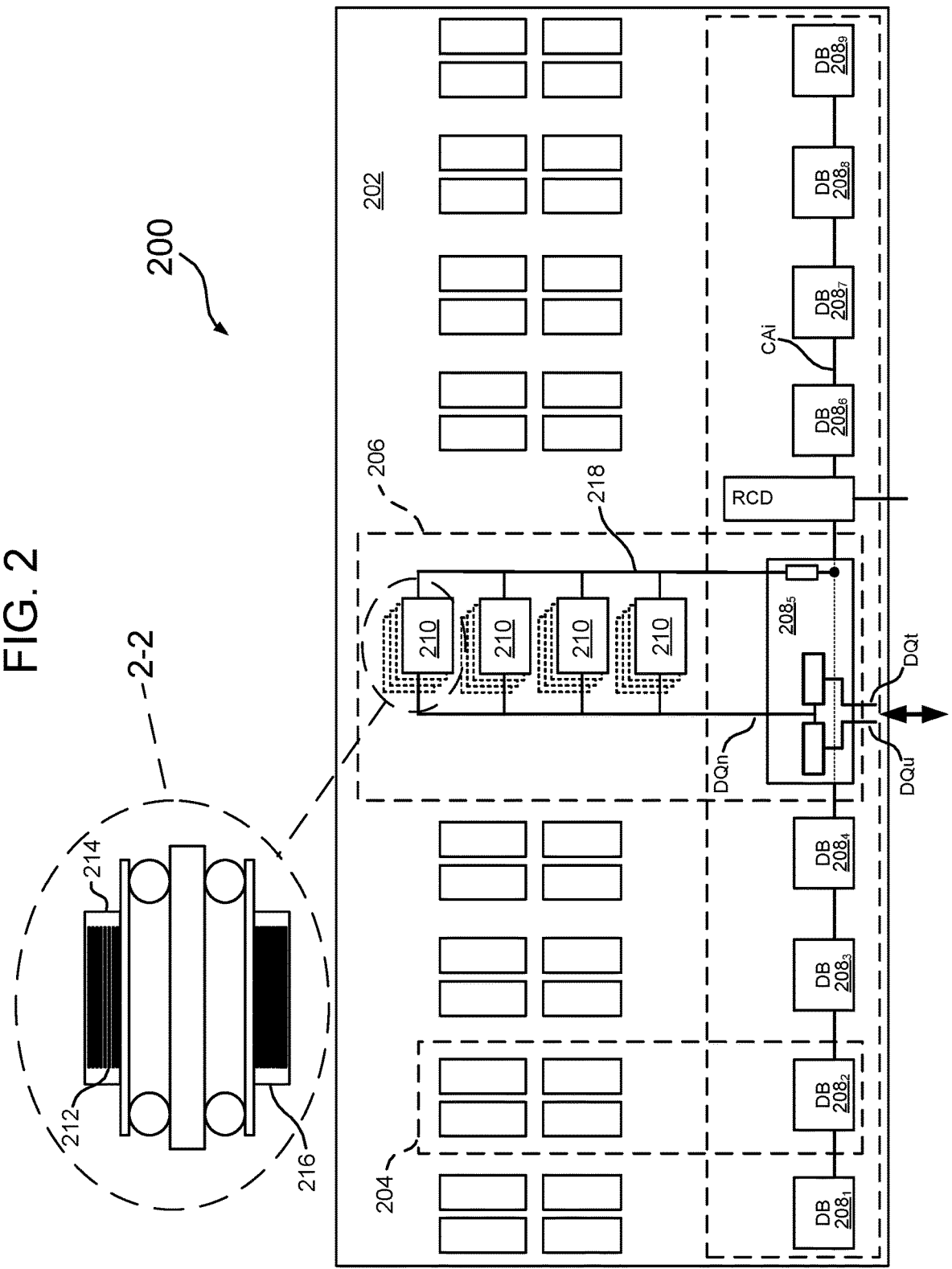
FIG. 2 illustrates one embodiment of the nonvolatile memory module shown in FIG. 1.

FIG. 2 illustrates one specific embodiment of a non-volatile memory module, generally designated 200, that may be suitable for inclusion in the system 100 of FIG. 1. The non-volatile memory module 200 includes a substrate 202 that mounts multiple groups of components, such as at 204 (in phantom), to achieve a desired module bandwidth in a point-to-point memory system with similar or different memory modules. A more detailed view of one of the groups of components is shown at 206, with the understanding that each group employs the same structure. With this in mind, each group includes a data buffer component DB 208$i$ (here, with nine groups shown, "i" is from one to nine) that interfaces with the memory control circuitry 110 (FIG. 1) via a first primary DQ nibble group DQu. The buffer component also interfaces with a primary nibble group DQt that is shared with another memory module. For one embodiment, each data nibble group includes four data DQ links and a differential strobe DQS link (not shown). A secondary data DQ nibble group DQn couples each data buffer component 208$i$ to a set of non-volatile memory devices 210. While FIG. 2 illustrates the non-volatile memory module 200 as employing nine data buffer components DB 208$_1$-DB 208$_9$ (to accommodate data transfers protected by error codes that are also used by DRAM memory modules), the buffer components could alternatively be merged into a smaller number of wider components (such as three components, each with six primary nibble interfaces, for example).

Further referring to FIG. 2, for one specific example, the set of non-volatile memory devices 210 includes four stacks of non-volatile memory die. Each stack may contain eight non-volatile memory components. The interface of each non-volatile memory component may be connected in parallel using through-silicon-vias, or any other connection method. Other stacking configurations are also possible. One example of a stacked set of devices is shown in the magnified view 2-2, illustrating stacked components 212 within a single package 214. For some configurations, the opposite side of the module substrate 202 may mount memory components, such as at 216.

With continued reference to FIG. 2, the non-volatile memory module 200 includes a control/address (CA) buffer component RCD that drives intermediate CAi links connecting to each data buffer component, such that each data buffer component drives secondary CAn links, at 218, to each non-volatile memory stack. In an alternative embodiment, the CA buffer could drive secondary CAn links to each non-volatile memory stack directly.

In an alternative embodiment, the non-volatile memory module 200 could also include DRAM components. The data buffer DB and CA buffer RCD components on the module would allow operation of the DRAM components (as on a conventional DRAM DIMM module) or operation of the NVM components as described above.

Figure 3:
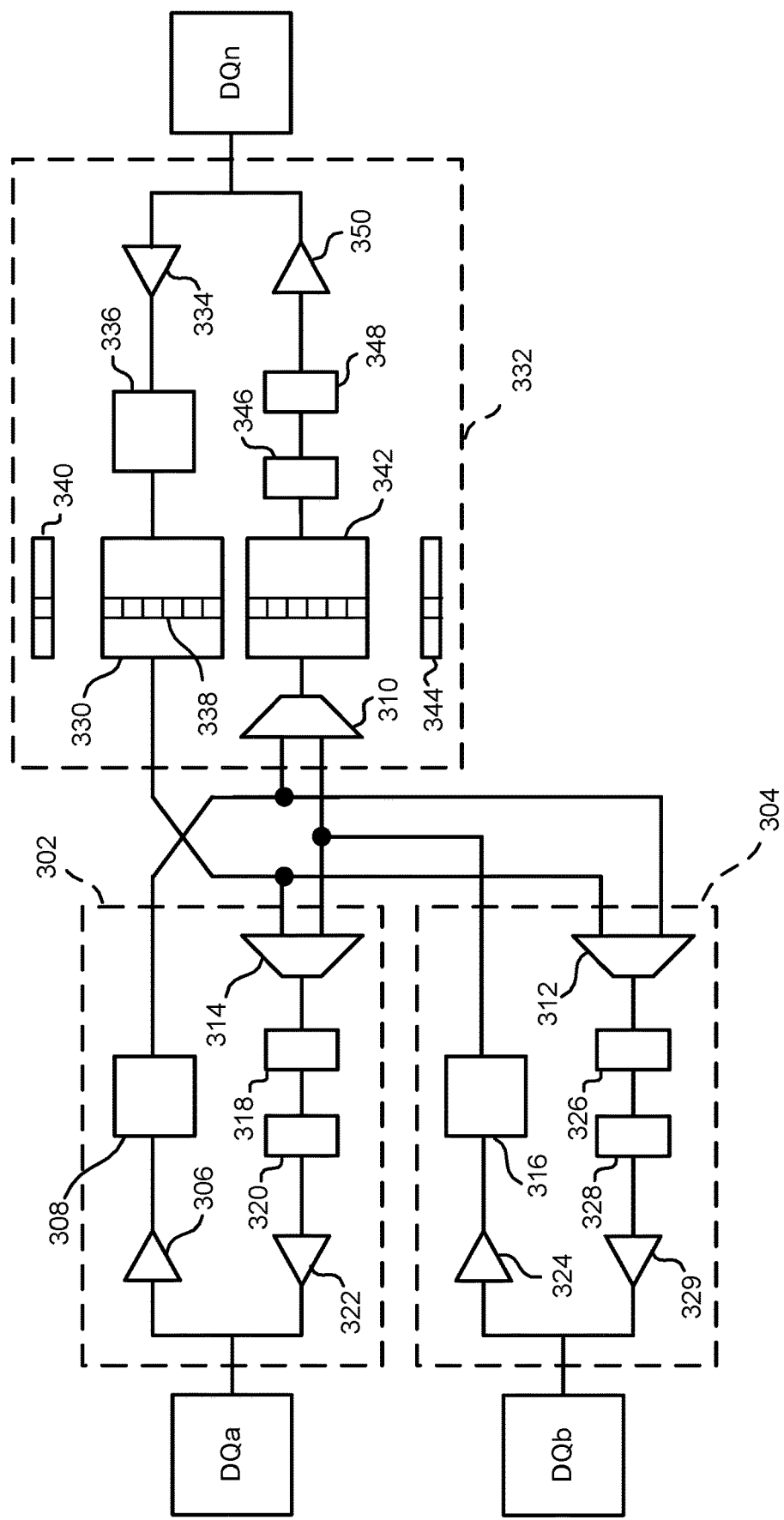
FIG. 3 illustrates one embodiment of steering logic employed in the nonvolatile memory module buffer circuit of FIG. 2.

FIG. 3 illustrates further detail of one specific embodiment of a data buffer component suitable for inclusion in the non-volatile memory module of FIG. 2. Generally, the data buffer includes control logic 300 that manages the non-volatile memory components that are connected to the secondary data DQn and control/address CAn links. The control logic 300 can manage concurrent transactions to more than one non-volatile memory component. This concurrency allows the module to achieve a high aggregate data transfer bandwidth.

Further referring to FIG. 3, the data buffer component includes two primary nibble interfaces DQa and DQb, each with independent receiver and transmitter logic circuits 302 and 304 coupled to each nibble interface. The first independent logic circuit 302 for the first primary nibble DQa includes a receive amplifier 306 that feeds a sampler 308. The output of the sampler is then routed to a secondary interface logic circuit multiplexer 310 and a transmit multiplexer 312 in the second primary nibble logic circuit 304. The first independent logic circuit 302 also includes a transmit logic path that employs a transmit multiplexer 314. The transmit multiplexer 314 selects from between a first input connected to the output of an SRAM memory 330 associated with a secondary logic circuit 332 for a secondary nibble interface DQn, and a second input coupled to a sampler 316 from the second independent logic circuit 304. The output of the multiplexer 314 feeds phase and cycle adjustment circuits 318 and 320, which couple to a transmit amplifier 322.

With continued reference to FIG. 3, the second independent logic circuit 304 associated with nibble interface DQb is similar to the first independent logic circuit 302. A receive amplifier 324 feeds the sampler 316, which feeds its sampled output to one input of the first logic circuit transmit multiplexer 314, and also an input of the transmit multiplexer 310 for the secondary logic circuit 332. The second logic circuit also includes a transmit logic path that employs the transmit multiplexer 312. The transmit multiplexer 312 selects from between a first input connected to the output of the SRAM memory 330, associated with a secondary logic circuit 332, and a second input coupled to the sampler 308 from the first independent logic circuit 302. The output of the multiplexer 312 feeds phase and cycle adjustment circuits 326 and 328, which couple to a transmit amplifier 329.

Further referring to FIG. 3, the secondary logic circuit 332 includes a read path that employs an amplifier 334 that feeds a sampler 336. The output of the sampler is fed to the SRAM memory 330 which serves as temporary storage for read data. For one specific embodiment, the read SRAM 330 may be organized into 2 KB data rows, or blocks, that include 64 bits per data column, such as at 338. A rank/bank/row address tag, at 340, provides an index to the column. With this arrangement, read data may be received into the SRAM from the non-volatile devices as block data (typical with non-volatile memory), aggregated in the SRAM, then retrieved from the read SRAM 330 as column data and fed to either or both of the transmit multiplexers 314 and 312.

With continued reference to FIG. 3, the secondary logic circuit 332 also includes a write path including the transmit multiplexer 310 which selects from between the output of sampler 308 (associated with DQa) or the output of sampler 316 (associated with DQb). The multiplexer output is then fed to temporary write SRAM storage 342 with a corresponding write index, at 344. The write SRAM storage 342 is organized similar to the read SRAM storage 330, except that write data is received within the SRAM as column data, aggregated in the SRAM, then dispatched to the non-volatile memory devices as block data. The output of the write SRAM is fed to respective phase and cycle adjustment circuits 346 and 348, then driven to the non-volatile memory devices via transmit amplifier 350.

The SRAM storage allows for concurrent transactions to take place, such that accesses to two different non-volatile memory components connected to the same data buffer can overlap. The storage also allows parallel transactions to be synchronized across all of the data buffer components. This feature is provided because the non-volatile memory module may use the same error detection and correction code (EDC) as that used by DRAM memory modules. Consequently, the access granularity is a multiple of nine and not a power of two. This permits a 9/8 transfer and storage overhead needed for a standard syndrome (such as ECC, Chipkill, etc.). A non-volatile memory transaction will thus involve a transfer between nine non-volatile memory components and the nine data buffer components on the module. This transfer will have a "block" granularity—typically 2 KB/4 KB/8 KB per non-volatile memory component. The overall transfer granularity will be 18 KB/36 KB/72 KB since nine DB components operate in parallel. The requestor in the controller will see a block size of 16 KB/32 KB/64 KB, since the EDC syndrome will be generated and checked in the controller interface. This block size is comparable to the row size of DRAM module (with 18 DRAMs operated in parallel).

Once the non-volatile memory data block is transferred to the temporary SRAM memory in the DB component, it can be accessed in column blocks (the same column access granularity as the DRAM module). The controller can perform column read accesses once a block read has moved the block data from nine non-volatile memory components to the SRAM memory of nine DB components. These column read accesses can transfer all of the block data or just part of the block data from the SRAM memory to the controller. It will typically take 512/1024/2048 column accesses to transfer a block of data between the SRAM memory and the controller, assuming column blocks of 64B and a non-volatile memory data block size of 2 KB/4 KB/8 KB.

If the controller wants to perform column write accesses, it will typically transfer all the block data from the controller to the SRAM memory (one column block at a time) before performing a block write access to transfer the block from the SRAM memory to the nine non-volatile memory components. If the controller only wants to write part of a block, it will be necessary to first read the block from the nine non-volatile memory components into SRAM memory, perform column write accesses to the SRAM memory, and then perform a block write access to transfer the modified block from the SRAM memory to the nine non-volatile memory components. This is also called a read-modify-write transaction.

In some situations, it is desirable to steer data received at one primary DQ (such as DQb), to the other primary DQ (such as DQa), thus bypassing the secondary interface circuit 332. This may be accomplished through use of a control signal applied to the appropriate multiplexer (here, by enabling the transmit multiplexer 314 to pass through the output from the sampler 316, and disabling the multiplexer 310 of the secondary interface, the data may pass from DQb to DQa).

The buffer logic circuit also provides a pipeline latency for the column data accesses that matches a pipeline latency associated with the DRAM module. A status bit generated in the logic generates a status return signal for any one of the following conditions (1) enabling parallel access to the non-volatile memory devices; (2) accommodating variable non-volatile memory access; and (3) accommodating larger non-volatile memory access granularity.

The receive-to-transmit paths of the data buffer component also provide functionality to change modes (that adjust phase relationships between timing signals) with respect to timing domains. Most of the DB component operates in a clock domain created from a CLK link (not shown) which accompanies the CA bus. There is a small part of the interface which operates in the domain of the received DQS timing signal (not shown) for the DQa interface. The buffer includes domain-crossing logic to perform the domain crossings between the two timing domains.

Figure 4:
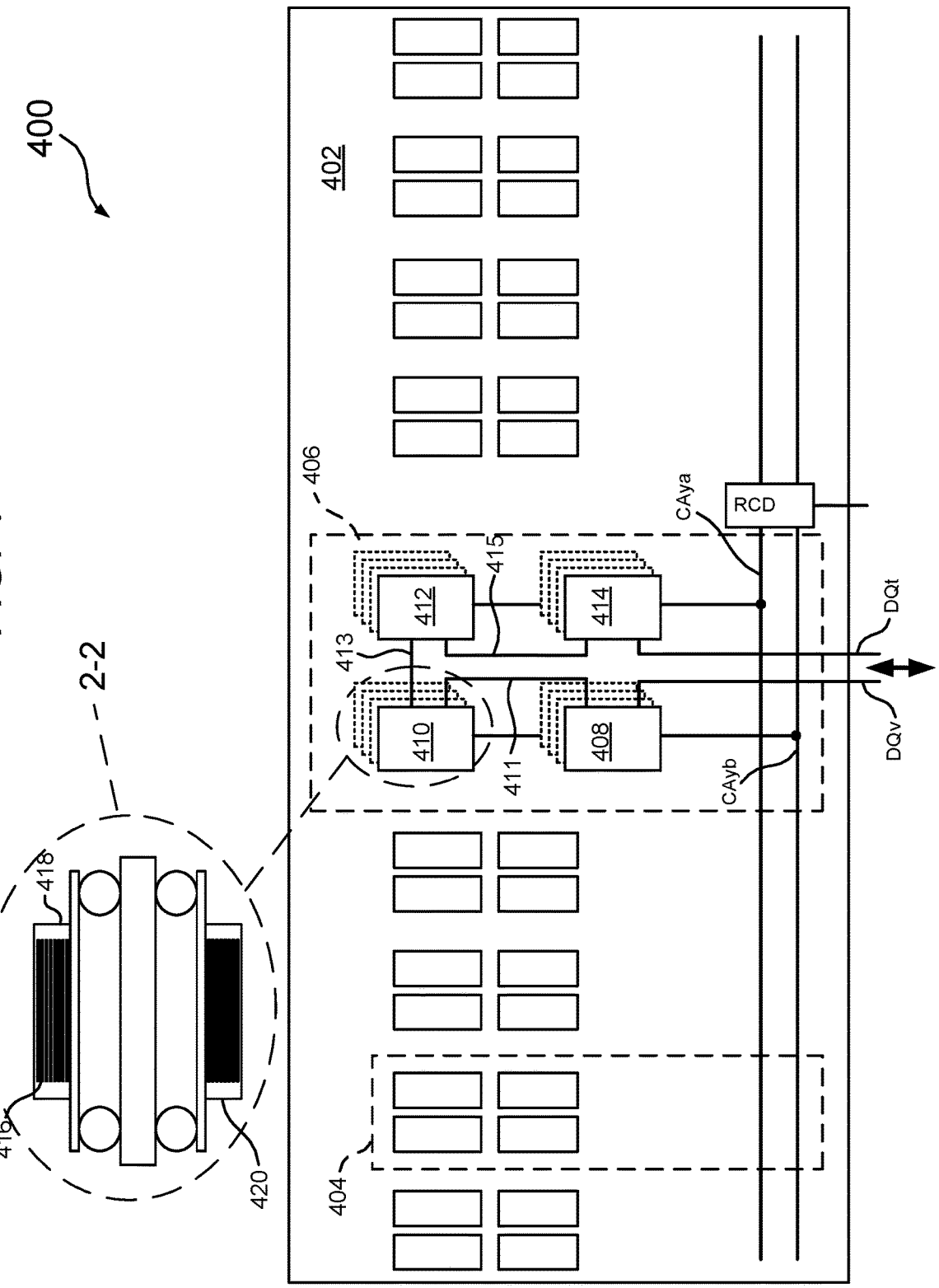
FIG. 4 illustrates one embodiment of the DRAM memory module of FIG. 1.

FIG. 4 illustrates one specific embodiment of a DRAM memory module, generally designated 400, that is suitable for the point-to-point memory system of FIG. 1, such that it may be combined with another DRAM memory module or the non-volatile memory module 200 such as that described above. The DRAM memory module 400 may be of the Registered Dual Inline Memory Module (RDIMM) type, and includes a substrate 402 that mounts multiple groups of components, such as at 404 (in phantom), to achieve a desired module bandwidth in a point-to-point memory system with similar or different memory modules. A more detailed view of one of the groups of components is shown at 406, with the understanding that each group employs the same structure. With this in mind, each group interfaces with the memory control circuitry 110 (FIG. 1) via a primary DQ nibble group, such as DQv. Another primary nibble group DQt allows the module to either interface with the memory control circuitry (for a single module configuration), or to interface with another module as a shared data path. For one embodiment, each data nibble group includes four data DQ links and a differential strobe DQS link (not shown).

Further referring to FIG. 4, for one specific example, each group of devices includes four stacks of DRAM memory die 408, 410, 412 and 414. Each stack may contain eight DRAM memory components. One example of a stacked set of devices is shown in the magnified view 4-4, illustrating stacked components 416 within a single package 418. For some configurations, the opposite side of the module substrate 402 may mount memory components, such as at 420. The interface of each DRAM memory component may be connected in parallel using through-silicon-vias, or any other connection method. Other stacking configurations are also possible.

With continued reference to FIG. 4, for one embodiment, the four stacks of DRAM devices 408-414 may be interconnected in a ring configuration, such that the first DRAM stack 408 interfaces directly with the DQv nibble. The second stack 410 couples to the first stack 408 via a nibble of paths at 411. The second stack 410 is tied to the third stack 412 via a nibble of paths at 413, while the fourth stack 414 couples to the third stack 412 via a nibble of paths at 415. The fourth stack 414 also connects directly to the DQt nibble.

With continued reference to FIG. 4, the DRAM memory module 400 includes a control/address (CA) buffer component RCD that drives intermediate CAi links CAya and CAyb connecting to pairs of DRAM memory stacks. For this configuration, a given pair of DRAM stacks, such as at 408 and 410, may be accessed independently of the pair of stacks at 412 and 414.

Operation of the various system components described above will begin with a discussion of the interactions between the memory control circuitry 110 and the non-volatile memory module 200. A variety of configurable operating environments will then be shown with a complete system, including the memory control circuitry, non-volatile memory module and a DRAM module.

Figure 5A:
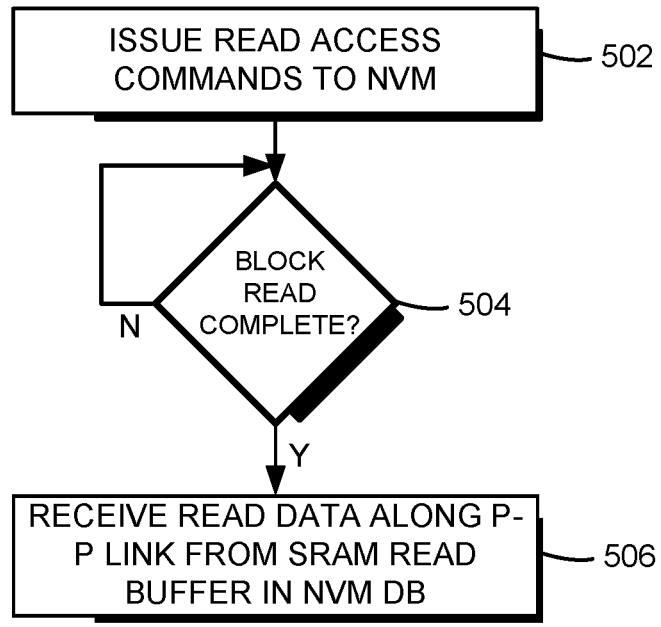
FIG. 5A shows a flow diagram of one embodiment of a method of reading data from a nonvolatile memory module from the perspective of the memory controller.

As noted above, various aspects of the circuitry described herein enable both non-volatile and DRAM memory modules to be used in point-to-point topologies to advantageously expand system storage capacity while maintaining performance. To support the inclusion of non-volatile memory modules into the system, for read operations the memory control circuitry generally operates in accordance with the steps shown in in FIG. 5A. Read access commands are issued to the non-volatile memory module along the primary CA bus, at 502. As explained below in the context of various system examples, the commands to the non-volatile memory module may be interleaved with commands to a DRAM memory module. After the commands are sent, the memory control circuitry waits for an indication or signal from the non-volatile memory module that the requested read data is ready for transmission from the module to the memory control circuitry, at 504. As more fully explained below, this "waiting" is a result of the non-volatile memory module buffer accumulating block read data from the non-volatile devices into the SRAM read buffer 330 (FIG. 3). Specific embodiments of how the indication or signal may be carried out are described below. The block read data is then read out to the memory control circuitry 110 as column read data. The read data is then received by the memory control circuitry 110, at 506, from the non-volatile memory module 200 as column read data along one of the primary DQ nibbles.

Figure 5B:
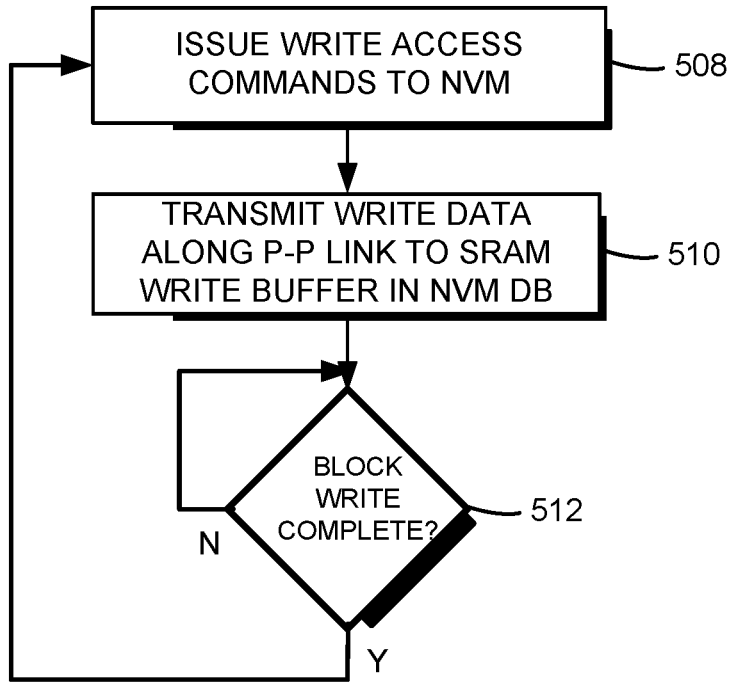
FIG. 5B shows a flow diagram of one embodiment of a method of writing data to a nonvolatile memory module from the perspective of the memory controller.

Referring now to FIG. 5B, from the perspective of the memory control circuitry 110, write operations are carried out similarly to read transactions, with the memory control circuitry 110 issuing write access commands to the non-volatile memory 200, at 508. Column write data is then transferred to the non-volatile memory module, at 510. As explained more fully below, the column write data is accumulated in the SRAM write buffer 342 (FIG. 3) until ready for transfer along the secondary DQ path to the non-volatile devices. When the block data accumulation is complete, the non-volatile memory module buffer sends the memory control circuitry an indication, at 512, that the write transfer is complete.

Referring now to FIG. 6A, from the perspective of the non-volatile memory module 200, read transactions begin by receiving read access commands from the memory control circuitry 110, at 602. As explained below, the commands that are received may be interleaved with commands dispatched to the DRAM memory module. Data in the form of read data blocks is accessed from the non-volatile memory devices 210, at 604, and aggregated as data blocks in the SRAM read data buffer 330, at 606. Once the block read is complete, at 608, a signal such as a status bit may be sent to the memory control circuitry 110, at 610, along a status line, indicating to the memory control circuitry that the block read is complete. The data is then transferred out of the SRAM read buffer 330 as column data along the point-to-point nibble to the memory control circuitry 110, at 612.

Figure 6B:
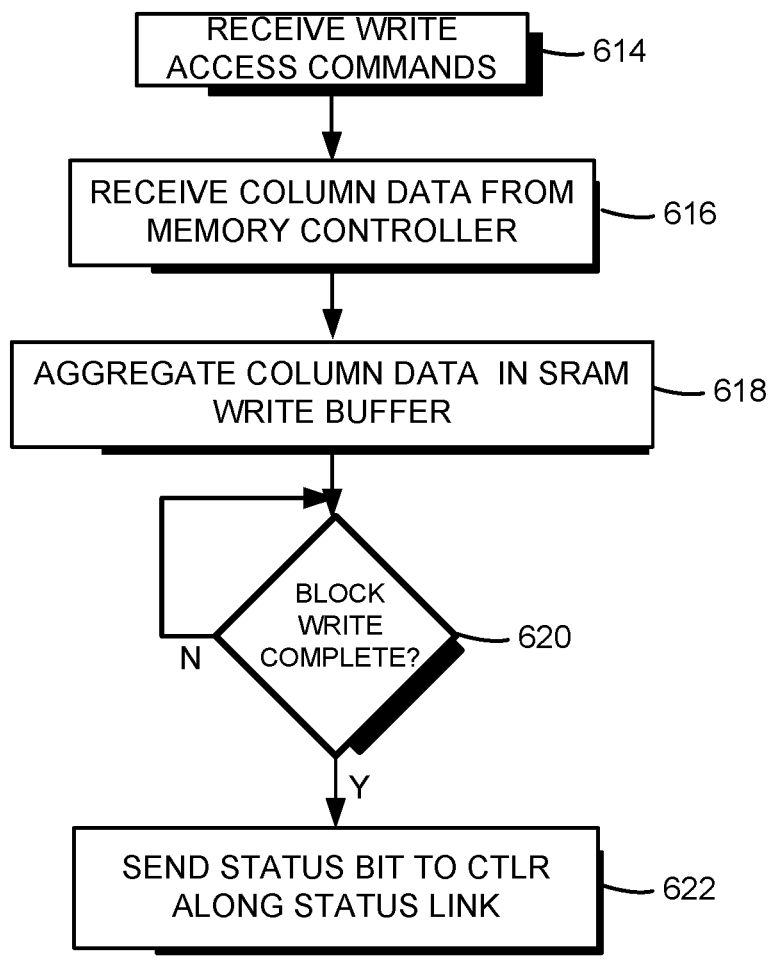
FIG. 6B illustrates one embodiment of a flow chart showing a write data transfer to the nonvolatile memory module from the perspective of the nonvolatile memory module.

Referring now to FIG. 6B, from the perspective of the non-volatile memory module 200, write operations are carried out similarly to read transactions, with the receipt of write access commands by the non-volatile memory, at 614. The SRAM write buffer 342 on the non-volatile memory module 200 then receives column write data from the memory control circuitry 110, at 616. The column data is aggregated in the SRAM write buffer 342, at 618. Once the column write data is completely aggregated, and organized into write block data for transfer to the non-volatile memory devices 210, at 620, a status bit is then generated by the buffer logic and sent to the memory control circuitry 110 along the status link, at 622.

Figure 7A:
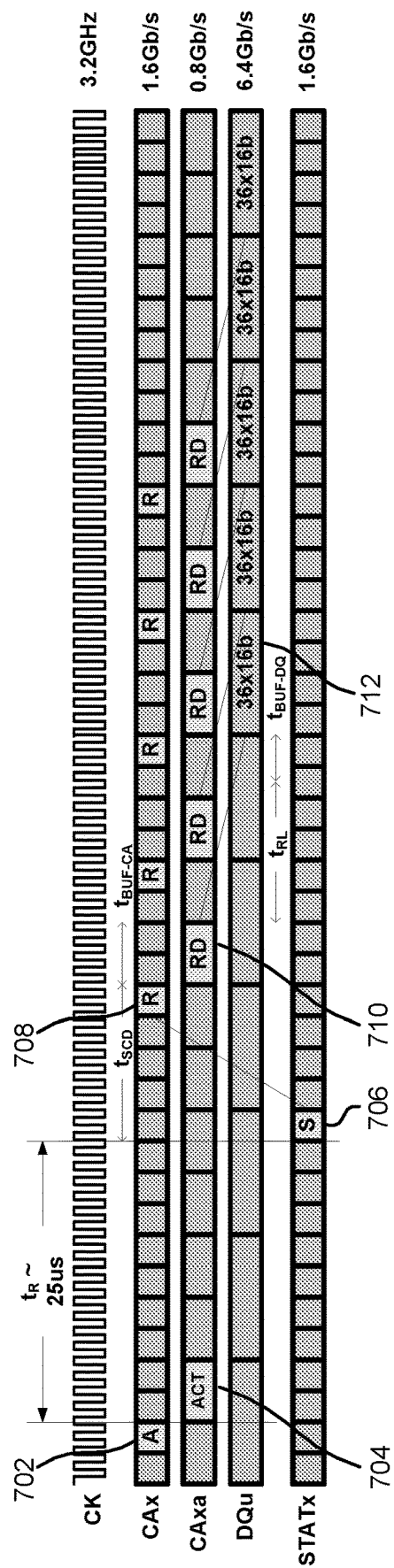
FIG. 7A illustrates one embodiment of a timing chart relating to the read data transfer of FIG. 6A.

FIG. 7A illustrates a timing chart showing the various timings for a sequence of read operations for the non-volatile memory module 200, and the timing for a status bit "S" as discussed above. The waveform CK represents a timing reference of 3.2 GHz, corresponding to a primary DQ signaling rate of 6.4 Gb/s for the transfer operations. At 702, an activate command is received by the non-volatile memory module from along the primary CA path CAx, and retransmitted at 704 along the secondary CA path CAxa. The non-volatile memory devices 210 then transfer block read data to the SRAM read buffer 330. After a time interval tR of approximately 25 micro-seconds, the internal transfer to the SRAM is complete, and a status bit "S" is transmitted to the memory control circuitry, at 706. In response to receiving the status bit, the memory control circuitry dispatches a set of read commands "R", beginning at 708, and retransmitted beginning at 710. Upon receiving the read commands, the data buffer circuitry reads the read data out of the SRAM as column data for transfer to the memory control circuitry, beginning at 712.

Figure 7B:
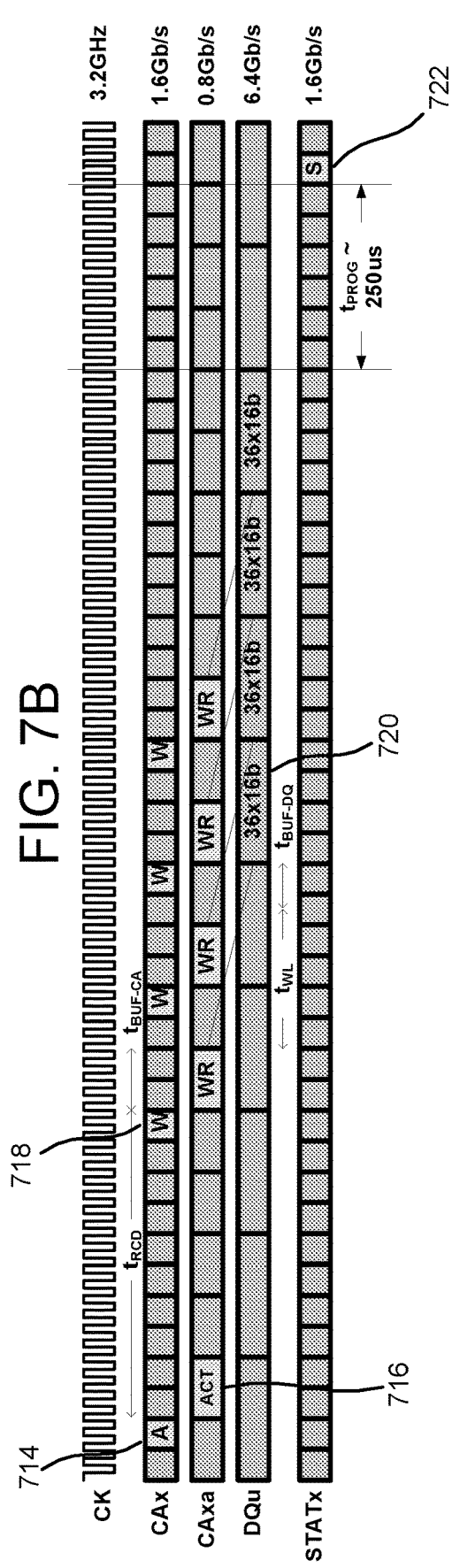
FIG. 7B illustrates one embodiment of a timing chart relating to the write data transfer of FIG. 6B.

FIG. 7B illustrates the timing for a set of write operations, and the corresponding timing for the status bit "S". At 714, an activate command is received by the non-volatile memory module from along the primary CA path CAx, and retransmitted at 716 along the secondary CA path CAxa. A series of write commands are then transferred by the memory control circuitry and received by the module beginning at 718. As noted above, the column write data is accumulated in the SRAM write buffer, and transferred to the non-volatile memory devices as block write data, beginning at 720. Once the block writes are finished, a status bit is generated by the data buffer and sent along the status link to the memory control circuitry, at 722. Receipt of the status bit informs the controller that the write operation is finished.

At the system level, where multiple modules interact with the memory control circuitry 110, various configurable transfer schemes are possible, depending on the application. Various examples to illustrate the schemes are presented below. Generally, the module configurations allow for adding capacity to a memory system without reducing performance, as well as allowing for the use of non-volatile memory modules with DRAM modules. The configurations also allow for apportioning total system bandwidth between the modules in balanced or unbalanced ways.

Figures 8, 9:
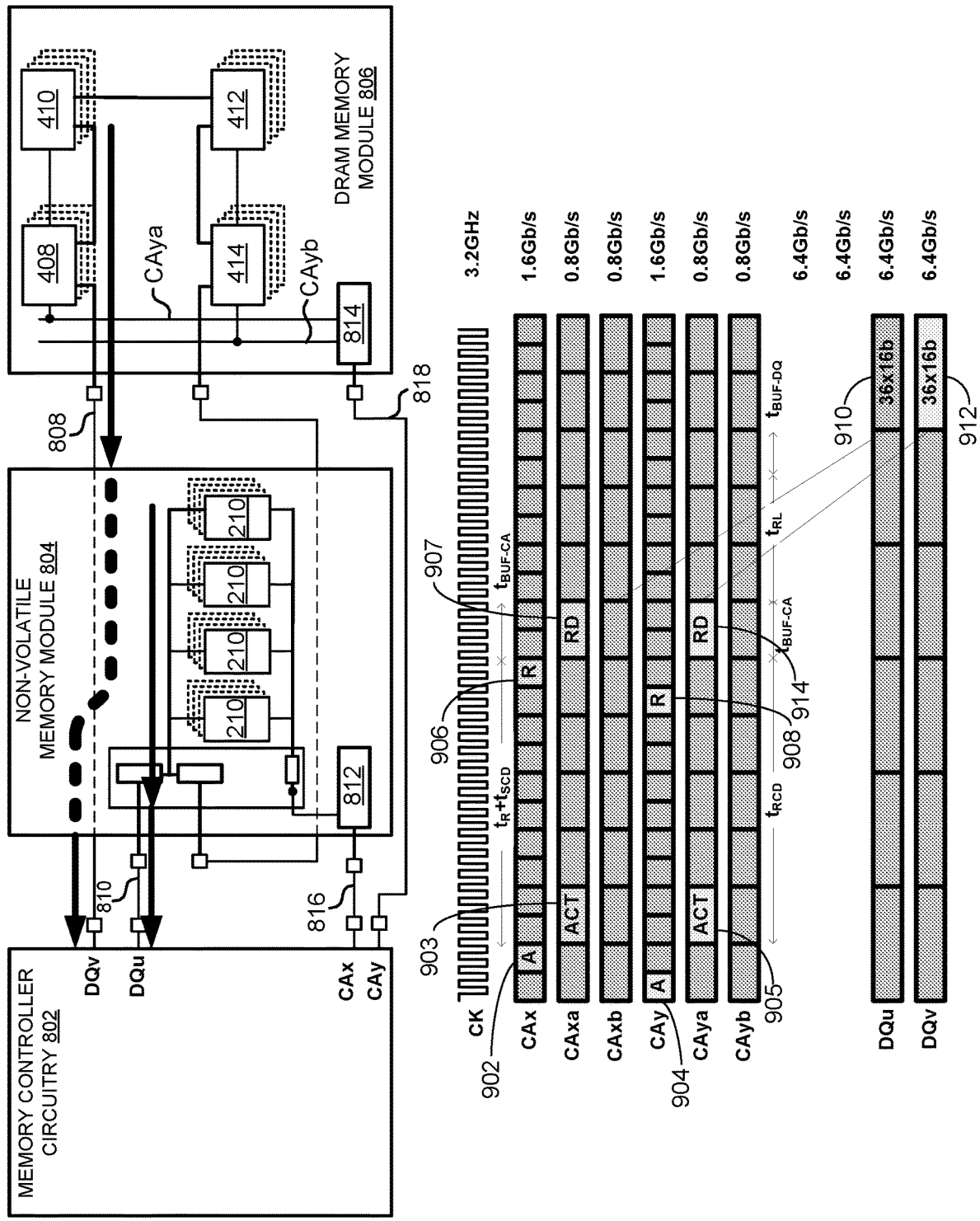
FIG. 8 illustrates a block diagram of a read data transfer involving the nonvolatile memory module and the DRAM memory module, where each module is allocated half the system bandwidth.
FIG. 9 illustrates a timing diagram associated with the read data transfers of FIG. 8.

Referring now to FIG. 8, a partial system view of a memory system, generally designated 800, is shown consistent with the structures described above. The partial system view includes memory control circuitry 802 and portions of a non-volatile memory module 804 and a portion of a DRAM module 806. The respective module portions may be thought of as respective "slices" or copies of circuitry corresponding to the non-volatile module nibble-pair group of components 206 (FIG. 2) and the DRAM module nibble-pair group of components 406 (FIG. 4). For clarity, like components for each module are labeled consistent with the labels of FIGS. 2 and 4. For one specific embodiment, a full system employs nine "slices" of the circuitry to carry out memory transfers.

Further referring to FIG. 8, the memory control circuitry 802 includes a first data nibble interface circuit DQv that connects to a corresponding nibble interface on the DRAM module 806 in a point-to-point relationship along data path 808. A second data nibble interface DQu connects to a corresponding nibble interface on the non-volatile memory module 804 in a point-to-point relationship along data path 810. While not shown, for some embodiments, source synchronous timing signal paths for clock or strobe signals accompanying the data may also be coupled between the memory control circuitry 802 and the modules 804 and 806 in point-to-point relationships proximate each data path. Respective CA interface circuits CAx and Cay connect the memory control circuitry 802 to each of the module RCD buffers 812 and 814 via point-to-point paths 816 and 818.

FIG. 9 illustrates one embodiment of a timing chart corresponding to the system of FIG. 8 that shows various interleaved commands and resulting data transfers associated with two concurrent read transactions, where half of the system bandwidth is allocated to the DRAM module 806, and half allocated to the non-volatile memory module 804. The waveform CK represents a timing reference of 3.2 GHz, corresponding to a primary DQ signaling rate of 6.4 Gb/s for the transfer operations. The relative signaling rate of the buses will scale up or down as the primary DQ rate changes. Each of the interleaved read transactions includes an activate command, shown at 902 and 904, a read command, shown at 906 and 908, and read data, shown at 910 and 912.

Further referring to FIG. 9, the first read transaction begins with an activation command "A", at 904, dispatched from the controller on the CAy bus. For one embodiment, this bus has a point-to-point topology and a signaling rate of 1.6G b/s, which is one-quarter the signaling rate of the point-to-point DQ buses. The RCD component on the DRAM module 806 receives the activate command "A" and retransmits the command information as an "ACT" command on the secondary CA bus CAya, at 905 (the CA bus CAyb is not utilized in this example since only the upper DRAM components 408 and 410 are accessed for the read transaction). The secondary CA bus CAya operates at 0.8 Gb/s, which is half the speed of the primary CA bus Cay and one-eighth the speed of the primary DQ bus DQv. One reason for the reduced rate is that the secondary CA bus CAya is a multi-drop bus that connects to about one-fourth of the DRAM stacks on the module. The memory control circuitry 802, after delaying an appropriate amount to compensate for buffer delays, then dispatches the read command "R", at 906, which is retransmitted by the CA buffer component RCD as "RD", at 914, along the CAya bus. The read data is then accessed from the DRAM components 408 and 410, and transferred to the memory control circuitry 802, at 912, along the primary DQ path DQv.

Concurrent with the first read transaction described above, and with continued reference to FIGS. 8 and 9, the second read transaction begins with an activation command "A", at 902, dispatched by the memory control circuitry along primary CA path CAx. The RCD component on the non-volatile module 804 receives the activate command "A" and retransmits the information "ACT" on the secondary CA bus CAxa, at 903. The memory control circuitry 802 then dispatches the read command "R", at 906, which is retransmitted by the RCD component as "RD", at 907, along the CAxa bus. The read data is then accessed from the non-volatile components 210, accumulated by the buffer as block data, and transferred to the memory control circuitry 802, at 910, as column data along the primary DQ path DQu.

For the read transaction examples shown above with respect to FIGS. 8-17, the commands and data for each transaction are generally pipelined. This means that they occupy fixed timing positions with respect to the transaction, and it also means that the transactions may overlap other transactions. Note that write transactions corresponding to each configurable example discussed in FIGS. 8-17 are carried out similar to the read operations, but with different fixed timing positions of the commands and data.

The read transactions described above also illustrate timing intervals that may be shorter than what are associated with a typical system. For example, the activate ACT to read command RD spacing tRCD is shown as 6.25 ns, but would be about 12.5 ns for a typical DRAM component. This compression of the time scale is done for clarity, and does not affect the technical accuracy of the embodiments presented herein. The pipeline timing works equally well with a tRCD delay of 12.5 ns.

As to transaction granularity, the examples above illustrate a granularity of 64 bytes. As a result, there are enough command slots to allow each of the primary DQu and DQv slots to be filled with data. Each transaction performs a random row activation and column access on each group of 64 bytes ("36×16 b"). Additionally, each byte is assumed to be 9 bits in size. This extra size accounts for the syndrome of an error detection and correction code (EDC). If there are bank conflicts in the transaction stream, and if the transaction stream switches between read and write operations, then data slots may be skipped. This form of bandwidth inefficiency is present in all memory systems. No additional resource conflicts are introduced by the embodiments described herein.

Figure 10:
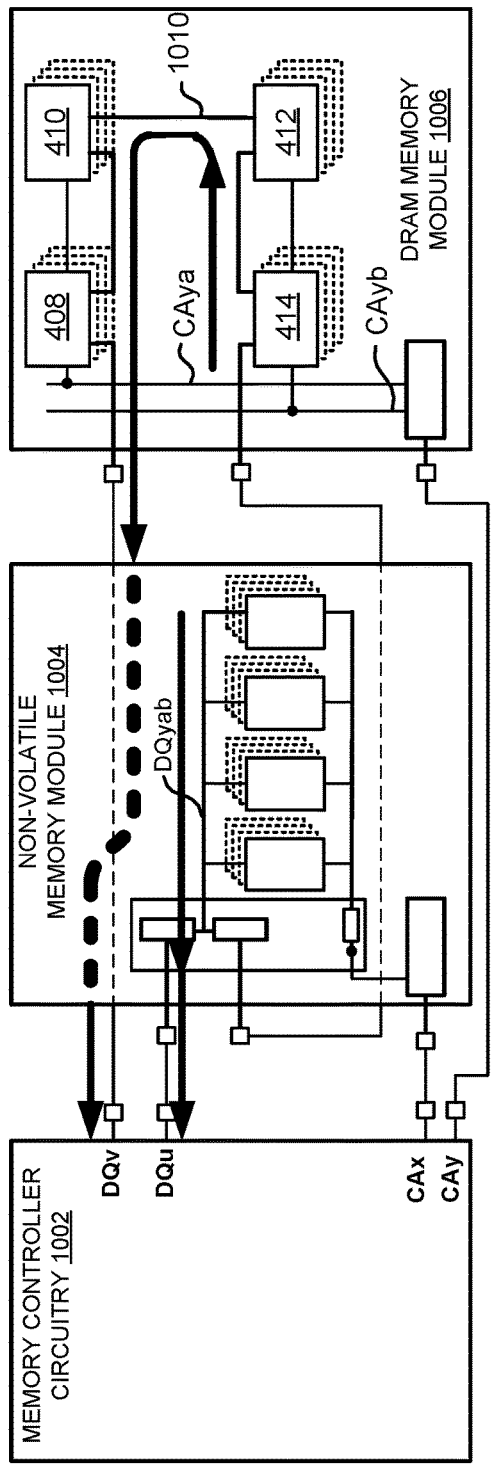
FIG. 10 illustrates a block diagram of a read data transfer, similar to FIG. 8, involving the nonvolatile memory module and the DRAM memory module, where each module is allocated half the system bandwidth.
Figure 11:
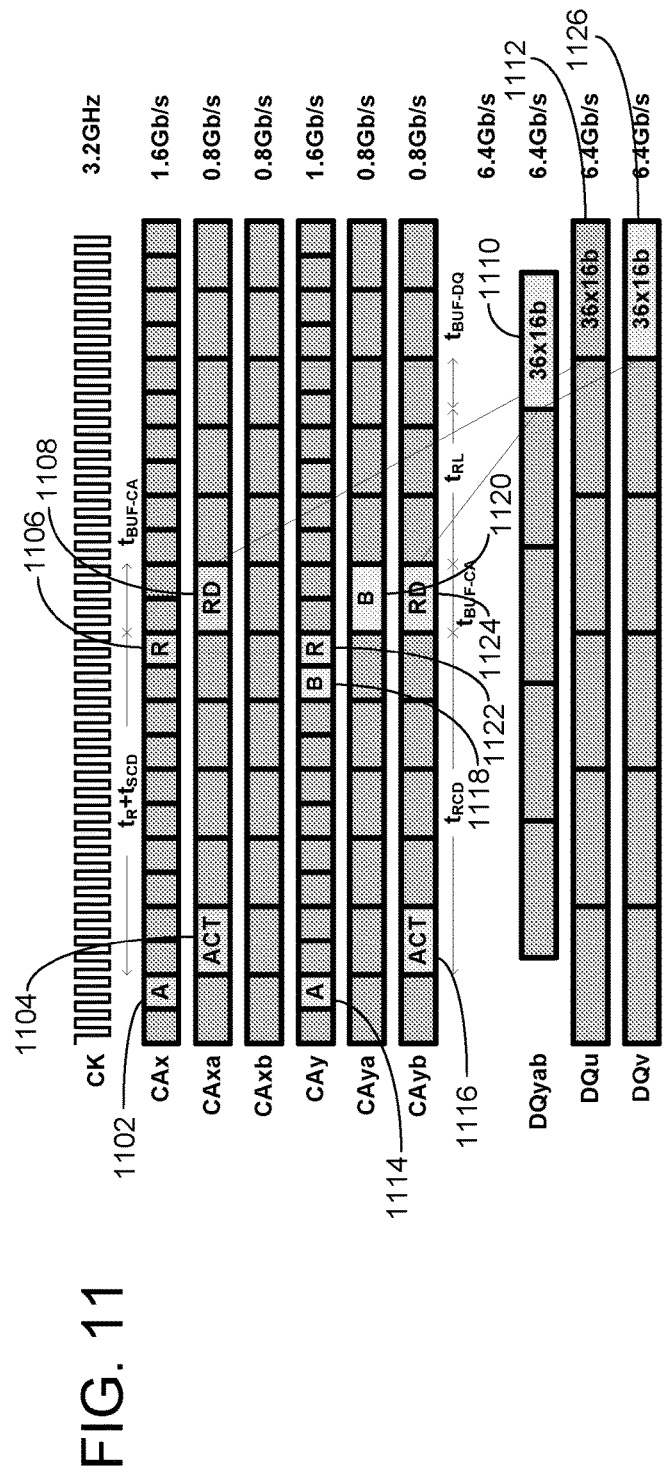
FIG. 11 illustrates a timing chart relating to the read data transfer of FIG. 10.

FIGS. 10 and 11 illustrate a system operation example similar to that shown in FIGS. 8 and 9, with 50% of the system bandwidth allocated to a non-volatile memory module 1004, and 50% allocated to a DRAM module 1006. However, in this example, instead of the upper DRAM devices 408 and 410 being accessed, the lower devices 414 and 412 devices are accessed. This is accomplished by dispatching the commands on the secondary CA bus CAyb, and utilizing a bypass path formed by the "ring" configuration of connections between the various DRAM component stacks.

Thus, referring now to FIG. 11, a read access to the non-volatile memory module 1004 involves receiving an activate command "A" on the CAx bus, at 1102, and retransmitting the command as "ACT" on the secondary CA bus CAxa, at 1104. A corresponding read command is then received, at 1106, following a tR+tSCD interval, and retransmitted at 1108, following a buffer delay tBUF. The resulting read data is then transmitted on the secondary DQ paths DQyab, at 1110, then transferred to the memory control circuitry via the DQ primary nibble path DQu, at 1112.

Concurrent with the read transaction to the non-volatile memory module 1004, the DRAM memory module 1006 receives an activate command "A" along the primary CA bus CAy, at 1114, and retransmits the command as "ACT" along the secondary CAyb bus, at 1116. Immediately prior to receiving a read command, a bypass control signal "B" is received, at 1118, and retransmitted at 1120 along the secondary CAya bus, enabling the bypass data path between the upper and lower DRAM component stacks, at 1010. A read command "R" is then received, at 1122, and retransmitted along the secondary CA bus CAyb, at 1124. The resulting read data is driven along the bypass path 1010, and then transferred along the primary DQ nibble path DQv to the memory control circuitry, at 1126.

Figure 12:
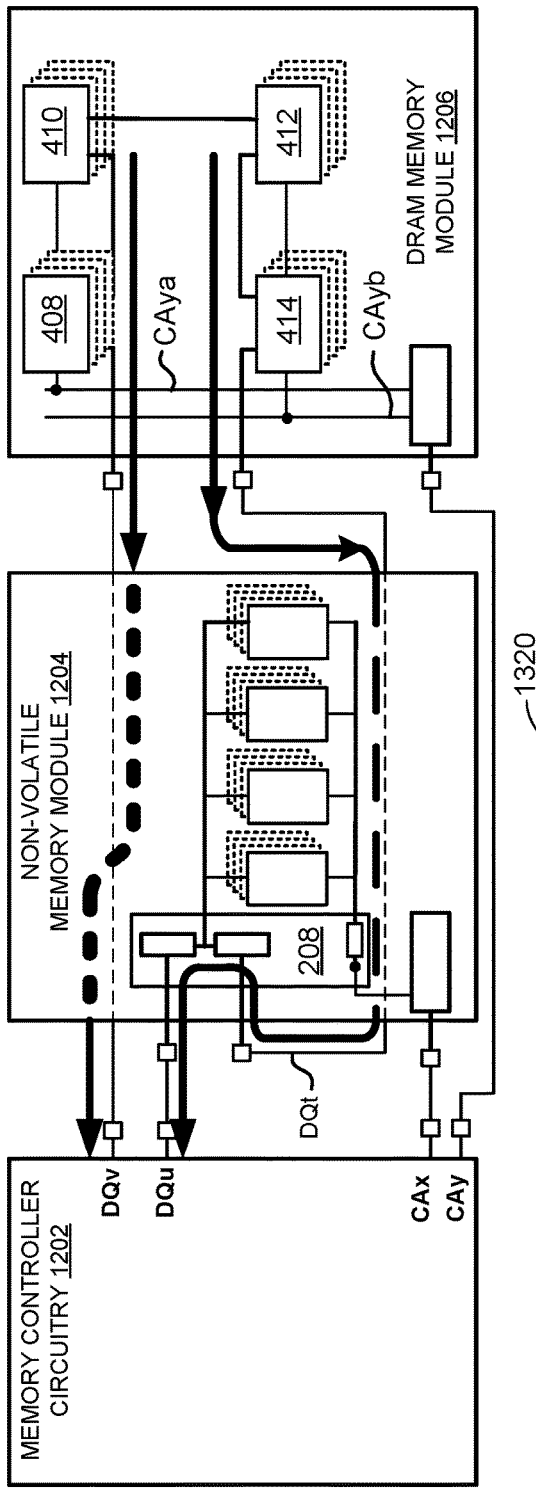
FIG. 12 illustrates a block diagram of a read data transfer, similar to FIGS. 8 and 10, but with the entire system bandwidth allocated to the DRAM memory module.
Figure 13:
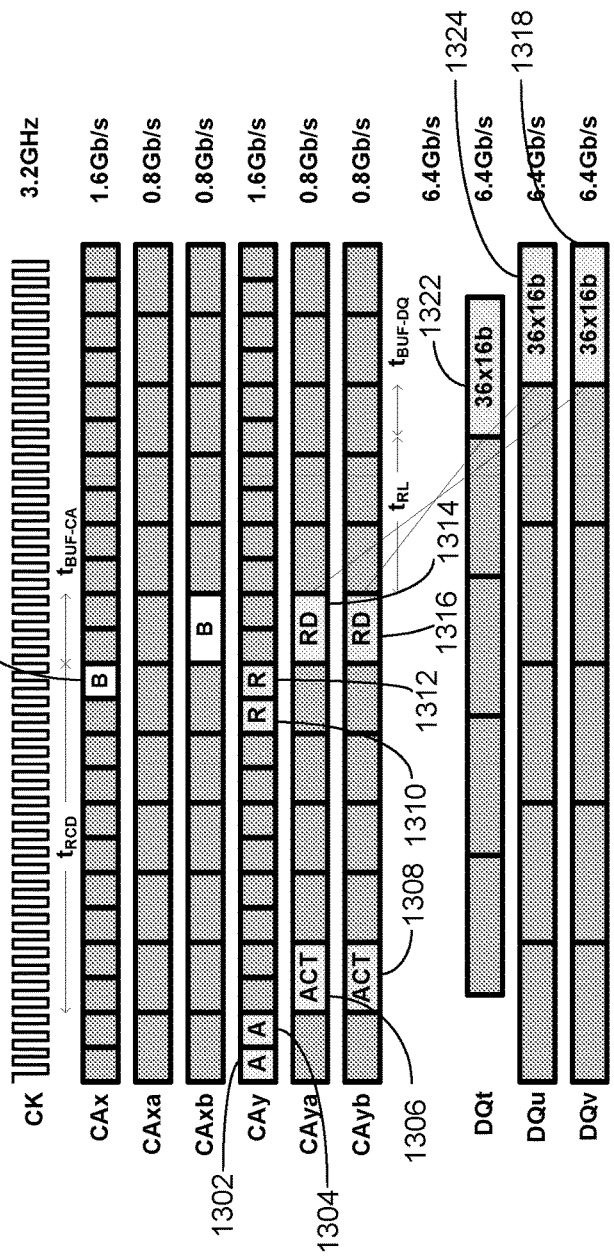
FIG. 13 illustrates a timing chart relating to the read data transfer of FIG. 12.

Referring now to FIGS. 12 and 13, a further embodiment employs both a non-volatile memory module 1204 and a DRAM memory module 1206, where the entire system bandwidth may be allocated to the DRAM module 1206. As shown in FIG. 12, read data from upper DRAM module stacks 408 and 410 are accessed and driven directly back to memory control circuitry 1202 via the primary DQv nibble path. Data from the lower DRAM stacks 412 and 414 are driven out onto the primary shared DQ path DQt, to the non-volatile memory module buffer 208, and retransmitted by the buffer along the primary DQ path DQu to the memory control circuitry 1202.

FIG. 13 illustrates the timing of the various commands and data for the example described above for FIG. 12. With the system bandwidth being fully allocated to the DRAM module 1206, respective activate commands "A" are sent by the memory control circuitry 1202 along the primary CA path CAy, and received by the DRAM module 1206, at 1302 and 1304. Since the upper and lower DRAM stacks respond to commands sent on independent secondary CA paths CAya and CAyb, both activate commands "A" are retransmitted along the two secondary CA paths, at 1306 and 1308. Corresponding read commands "R" are then received along the primary CA link CAy, at 1310 and 1312, and retransmitted along the secondary paths CAya and CAyb at 1314 and 1316. Read data from the upper DRAM components is then transferred, in response to the read command from the secondary link CAya, directly to the memory control circuitry 1202 along the primary DQ path DQv, at 1318. A bypass command "B", at 1320, activates the steering logic in the non-volatile data buffer 208 such that the buffer secondary interface (including the buffer storage SRAM) is bypassed. The read data responsive to the read command "R" from the secondary link CAyb is then transferred to the non-volatile memory module 1204 along primary DQ path DQt, at 1322, incurs a buffer delay due to its retransmission from the buffer 208, and transferred to the memory control circuitry 1202 via the primary DQ path DQu, at 1324.

Figure 14:
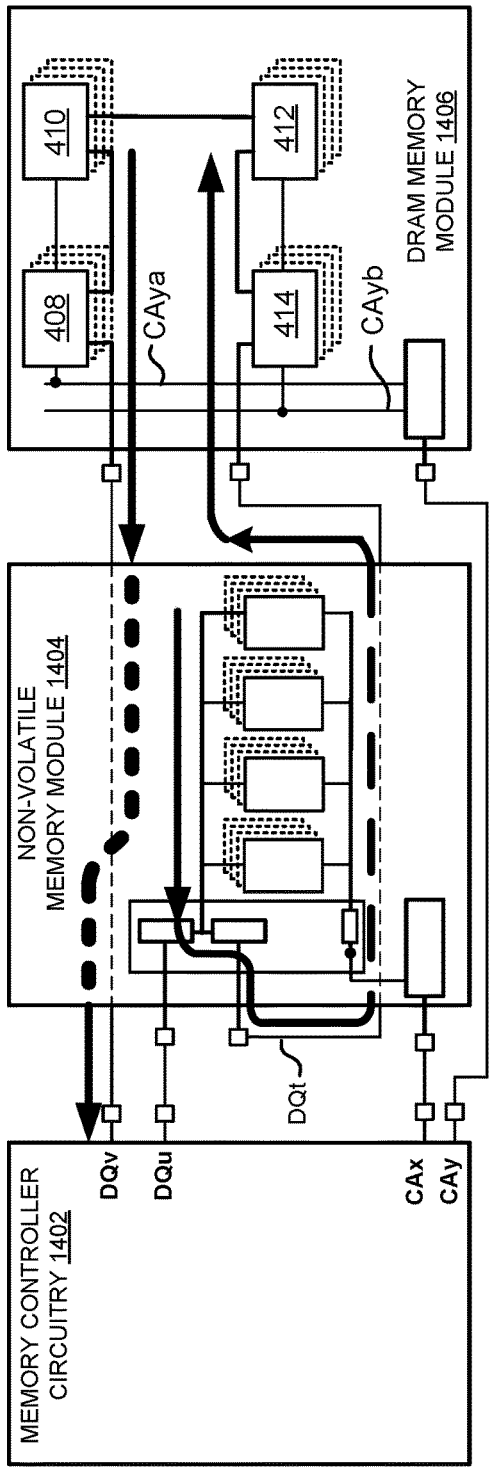
FIG. 14 illustrates a block diagram of a read operation from the DRAM module, and a read operation from the nonvolatile memory module that directly transfers write data to the DRAM module in a separate write operation.
Figure 15:
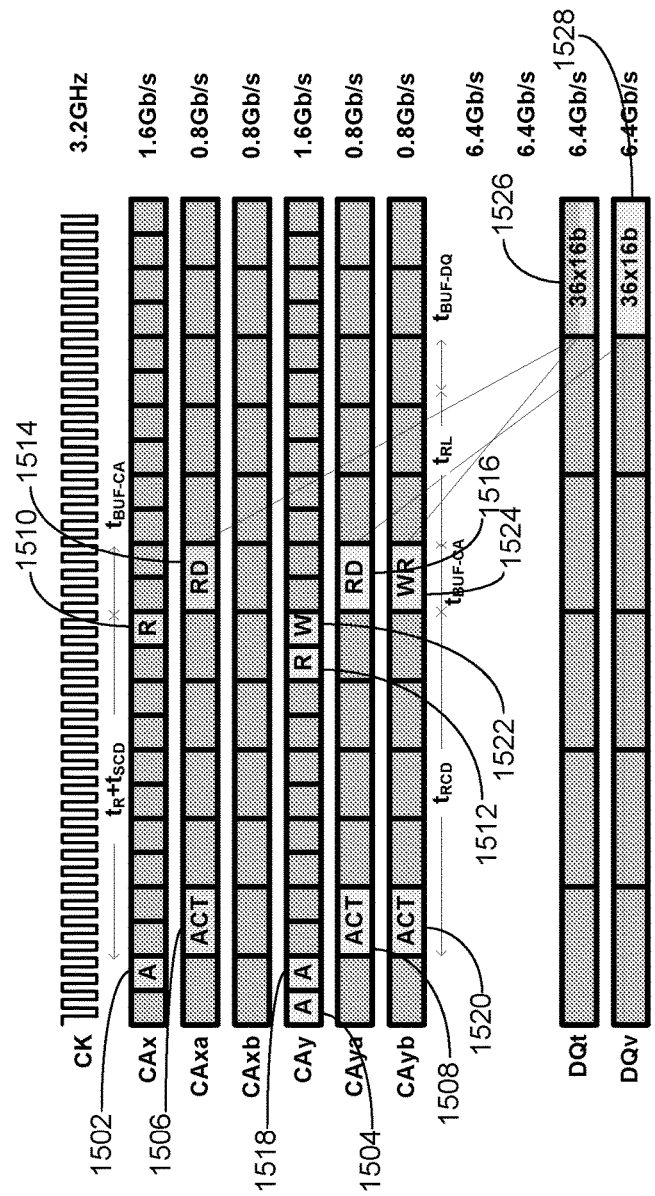
FIG. 15 illustrates a timing diagram relating to the data transfers of FIG. 14.

In yet a further system embodiment that employs both a non-volatile memory module 1404 and a DRAM memory module 1406 in a point-to-point topology, the two modules may transfer data directly between one-another. This example is illustrated in FIGS. 14 and 15. Generally, as shown in the partial system diagram of FIG. 14, data from, for example, upper DRAM stacks 408 and 410 may be read from the DRAM module 1406, while concurrently, data may be read from the non-volatile memory module 1404, and transferred as write data to the lower DRAM stacks 412 and 414 of the DRAM module 1406. In effect, three transactions occur concurrently.

FIG. 15 illustrates the timing of the various commands and data for the example described above for FIG. 14. Each of the two read transactions includes an activate command "A", transmitted along primary CA links CAx and CAy, at 1502 and 1504. The commands are then retransmitted along the secondary CA paths CAxa, at 1506, and CAya, at 1508. Corresponding read commands are then received, at 1510 and 1512, and correspondingly retransmitted along the secondary CA paths, at 1514 and 1516.

The single write transaction includes an activate command "A", at 1518, which is retransmitted at 1520. A write command is then received, at 1522, and retransmitted at 1524. For this example, the write data that is used is generated by the read transaction to the non-volatile memory. The timing of the write transaction is configured to match the read transaction with respect to the interval from the column command to the column data. The data is transferred on the shared DQ bus DQt, at 1526, between the two modules. Additional read data is transferred directly to the memory control circuitry via the DQ path DQv, at 1528. When the command-to-data interval for a write operation matches a read operation, the memory control circuitry 1402 accounts for the bank usage when a transfer transaction or a write transaction to a DRAM stack is followed by a read transaction to the same stack.

The transfer example of FIGS. 14 and 15 may have different variations, depending on the application. Some of these variations include: [1] The transfer can include a column read operation from an NVM stack coupled (via the DQt bus) to a write operation on a DRAM stack (along with an independent column read operation from another DRAM stack to the controller via the DQv bus)—this is the example described above in the context of FIGS. 14 and 15. [2] The transfer can include a column read operation from a DRAM stack coupled (via the DQt bus) with a column write operation to a non-volatile memory stack (along with an independent column read operation from another DRAM stack to the controller via the DQv bus). [3] Transfer [1] or [2] above, in which the independent operation is a column write operation to another DRAM stack. [4] Transfer [1] above, in which the column read operation from a non-volatile memory stack is also driven onto DQu bus to the memory control circuitry (as well as onto the DQt bus to a write operation on a DRAM stack). [5] Transfers [1], [2] or [3] above, in which a second independent column read operation from a non-volatile memory stack to the controller via the DQu bus is performed. [6] Transfers [1], [2] or [3] above, in which a second independent column write operation to a non-volatile memory stack from the memory control circuitry via the DQu bus is performed. Note that transfer variations of [5] and [6] above involve the non-volatile memory module being able to perform two simultaneous column operations (like the DRAM module).

The direct transfer operation between the non-volatile and DRAM modules described above may also be used for an alternative purpose. A dedicated physical space could be allocated in the DRAM devices, to be used as a temporary buffer for non-volatile memory read and non-volatile memory write operations. This would allow the SRAM buffer space in the non-volatile memory module to be reduced in size. This alternative would cause all non-volatile memory read and write operations to take place in two steps. In the case of a read, the non-volatile memory read data would be transferred across the DQt primary links to be written into the temporary DRAM buffer. When the non-volatile memory read had finished, the data block could be accessed in the DRAM buffer via the DQt/DQu links, as previously described. In the case of a write, the write data would be transferred across the DQt/DQu primary links to be written into the temporary DRAM buffer. When the DRAM buffer had a complete block, it would be written to the non-volatile memory module via the DQt links, as previously described.

For one alternative embodiment, the DRAM module employed in any of the system diagrams above may be of the Load Reduced Dual Inline Memory Module type, which is similar to the RDIMM DRAM memory module described with respect to FIG. 4, but also includes data buffer circuitry interposed between the DRAM components and the module pin interface. Each of the DRAM stacks may be connected to the buffer in a point-to-point configuration, rather than the ring configuration described earlier with respect to FIG. 4.

Figure 16:
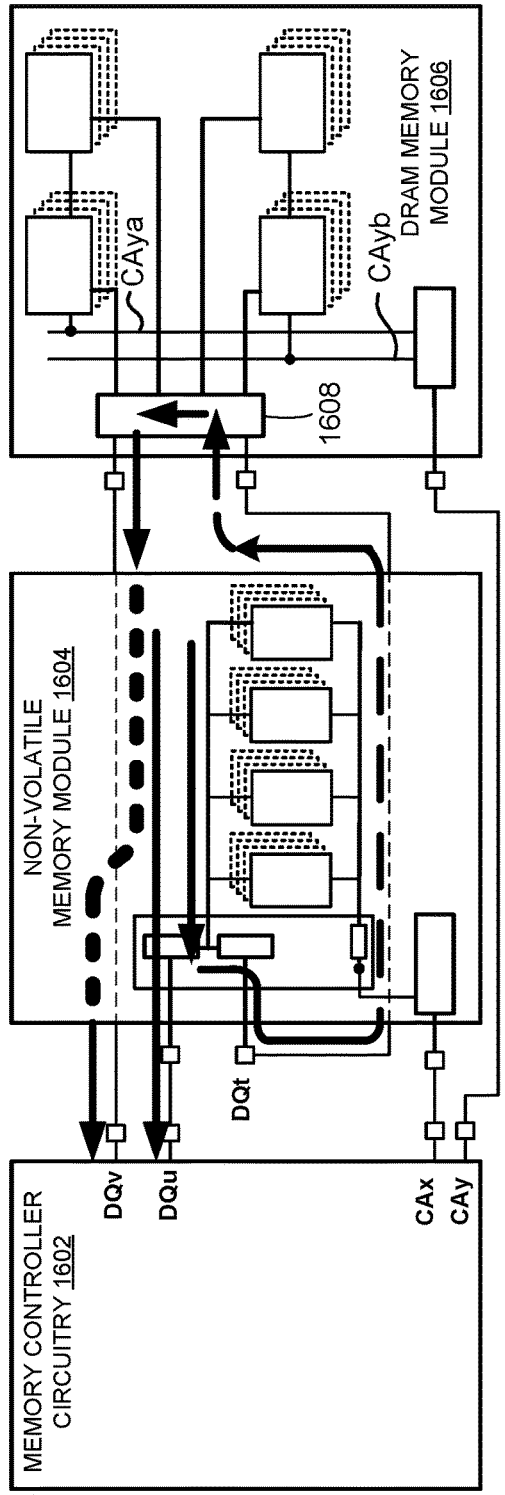
FIG. 16 illustrates a block diagram of a non-volatile memory module and a buffered DRAM memory module, and where the entire system bandwidth is allocated to the non-volatile memory module.
Figure 17:
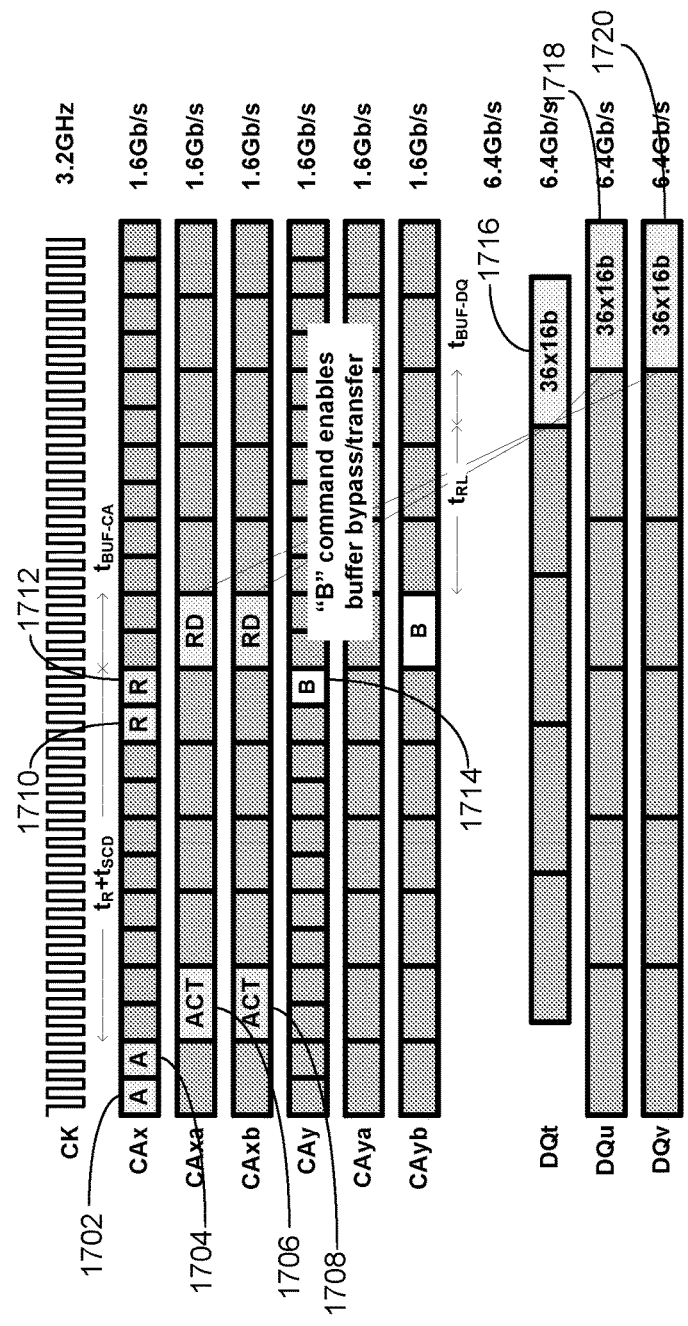
FIG. 17 illustrates a timing diagram relating to the read data transfers of FIG. 16.

Referring now to FIGS. 16 and 17, a further system embodiment employs both a non-volatile memory module 1604 and a DRAM memory module 1606 in a point-to-point topology where, in certain situations, the full system bandwidth may be allocated to the non-volatile memory module 1604. Generally, and referring now to FIG. 16, when paired with a buffered DRAM module, such as an LRDIMM, a nibble of data may be directly accessed from the non-volatile memory module 1604 directly to the memory control circuitry 1602 via primary DQ nibble path DQu, and a second nibble of data may be accessed from the non-volatile memory module 1604, concurrent with the first access, transferred to the buffered DRAM module 1606 via the shared DQ path DQt, then retransmitted by a DRAM buffer circuit, at 1608, directly to the memory control circuitry 1602 via DQ primary nibble path DQv.

FIG. 17 illustrates the timing of the various commands and data for the example described above for FIG. 16. Multiple activate commands "A" for the read nibbles are received, at 1702 and 1704, along the primary CA bus CAx, and retransmitted as "ACT" commands, at 1706 and 1708, along the respective secondary CA buses CAxa and CAxb. Corresponding read commands "R" are then received, at 1710 and 1712, and retransmitted. Concurrent with the receipt of the read commands, the DRAM module 1606 receives a bypass command "B" along the primary CA path CAy, at 1714, indicating to the DRAM buffer to enable a bypass for the read data being transmitted from the non-volatile memory module 1604 along the shared primary data path DQt. This data is shown at 1716, and the resulting data transmitted along the data paths DQu and DQv shown at 1718 and 1720, respectively. Note that the bypass control signal "B" may be dispatched by either the memory control circuitry 1602 or the non-volatile memory module 1604.

Figure 18:
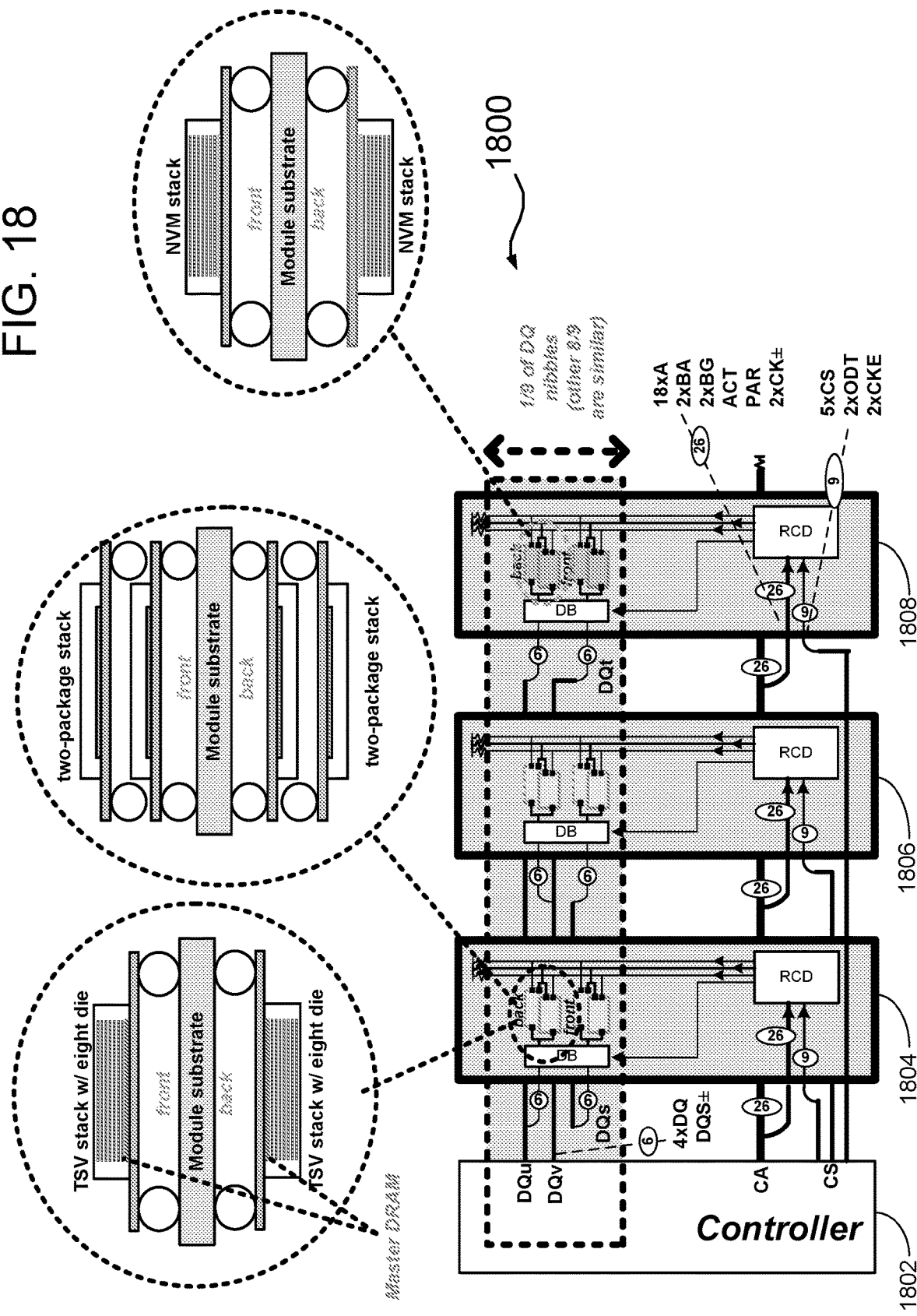
FIG. 18 illustrates an alternative system arrangement having two buffered DRAM modules and a non-volatile memory module.

The system examples described above are shown and described in a two-module context solely to provide clarity, and are meant to convey a general point-to-point architecture for multiple memory modules that may be of the same type, or mixed. One specific embodiment for a 3-module configuration is shown in FIG. 18. The system, generally designated 1800, includes memory control circuitry 1802 coupled to a pair of DRAM modules 1804 and 1806, and a single non-volatile memory module 1808. For the specific embodiment shown, each of the DRAM modules 1804 and 1806 are LRDIMMs, and employ a topology where, for each nibble-pair, one DQ nibble (such as DQu) connects to one of the DRAM sockets and the other DQ nibble (such as DQv) connects to the second DRAM socket. A third set of motherboard connections (such as DQs) connect the other DQ nibbles of the two DRAM module sockets together. The third socket may be used for the non-volatile module 1808, or a third DRAM module. The third socket may be coupled to the memory control circuitry 1802 in a legacy topology, where for each nibble-pair, both DQ nibbles DQu and DQv connect the controller interface to the socket interface.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A memory module comprising:
a pin interface for coupling to a point-to-point data bus, the point-to-point data bus for establishing a point-to-point connection between the memory module and a memory controller and dedicated to transfer data between the memory module and the memory controller;
at least two non-volatile memory devices;
a buffer disposed between the pin interface and the at least two non-volatile memory devices; and
wherein the buffer receives non-volatile memory access commands in accordance with a non-volatile memory commence protocol from the memory controller that are sequentially interleaved with dynamic random access memory (DRAM) memory module access commands for execution by a DRAM memory module separate from the memory module, the DRAM memory module having a point-to-point data relationship with the memory controller via a second point-to-point data bus dedicated to transfer second data between the memory controller and the DRAM memory module, the DRAM memory module access commands being in accordance with a DRAM command protocol that is different from the non-volatile memory command protocol.

2. The memory module of claim 1, wherein:
accesses to the at least two non-volatile memory devices involve storing error information in accordance with an error code, the error code employed by at least one DRAM module coupled to the memory controller.

3. The memory module of claim 2, wherein the error code comprises a 64/72 error detection correction code.

4. The memory module of claim 1, wherein the buffer comprises:
internal storage; and
logic to interpret commands from the memory controller to perform block accesses to the at least two non-volatile memory devices and transfer data blocks between the internal storage and the at least two non-volatile memory devices.

5. The memory module of claim 4, wherein:
the internal storage is to temporarily store data blocks transferred from the at least two non-volatile memory devices; and
the logic is to interpret commands from the memory controller to perform column accesses to the data blocks stored in the internal storage.

6. The memory module of claim 4, wherein:
the internal storage comprises static random access memory (SRAM).

7. The memory module of claim 1, wherein:
the logic further includes bypass circuitry to steer incoming signals through the pin interface without accessing the at least two non-volatile memory devices.

8. The memory module of claim 1, wherein the buffer generates a status return signal to the memory controller for at least one of (1) enabling parallel access to the at least two non-volatile memory devices, (2) accommodating variable non-volatile memory access, and (3) accommodating larger non-volatile memory access granularity.

9. The memory module of claim 1, wherein the buffer includes logic to process multiple accesses to the at least two nonvolatile memory devices, wherein the accesses are overlapped in time.

10. The memory module of claim 1, wherein the buffer includes at least two data interfaces coupled to the pin interface.

11. The memory module of claim 10, wherein each data interface comprises:
a group of four data links defining a nibble; and
a timing link.

12. The memory module of claim 11, wherein the pin interface is for coupling to the memory controller and the DRAM module, and wherein:
first signals transferred between the memory controller and the pin interface have a first phase alignment between a data link group and the timing link;
second signals transferred between the DRAM module and the pin interface have a second phase alignment between the data link group and the timing link; and
wherein the first phase alignment is different than the second phase alignment.

13. The memory module of claim 10, wherein:
a first data interface from among the at least two data interfaces provides access to a first group of non-volatile memory devices or to a second group of nonvolatile memory devices.

14. The memory module of claim 1, wherein:
the buffer receives the non-volatile memory access commands from the memory controller for first data, the non-volatile memory access commands being sequentially interleaved with the dynamic random access memory (DRAM) memory module access commands for second data that is independent of the first data.

15. A method of operation in a non-volatile memory module, the method comprising:
receiving a first read data transfer command in accordance with a non-volatile memory command protocol from a memory controller, the first read data transfer command for execution by the non-volatile memory module and sequentially interleaved with a second data transfer command for execution by a dynamic random access memory (DRAM) memory module, the second data transfer command being in accordance with a DRAM command protocol that is different from the non-volatile memory command protocol, the DRAM memory module coupled to the memory controller via a first point-to-point data link that is dedicated to data transfer between the DRAM memory module and the memory controller;
accessing data blocks from at least two non-volatile memory devices disposed on the non-volatile memory module in response to the first read data transfer command;
aggregating the accessed data blocks as aggregated data in a buffer circuit disposed on the non-volatile memory module; and transferring the aggregated data as column read data to the memory controller via a second point-to-point data link, the second point-to-point data link dedicated to data transfers between the memory controller and the non-volatile memory module.

16. The method according to claim 15, further comprising:
selectively steering a second data transfer operation, responsive to the second data transfer command, through the buffer circuit between the DRAM memory module and a memory controller.

17. The method according to claim 15, wherein the accessing comprises accessing an error code syndrome associated with the data blocks.

18. The method according to claim 15, further comprising:
generating a status signal upon completion of a predefined level of the aggregating corresponding to a block read from the at least two non-volatile memory devices in parallel; and
transmitting the status signal to a memory controller.

19. The method according to claim 15, wherein the transferring of the aggregated data is carried out via a point-to-point link.

20. The method according to claim 15, wherein the transferred column read data is transferred to the dynamic random access memory (DRAM) module.

* * * * *